(12) United States Patent
Hirose

(10) Patent No.: US 10,432,081 B2
(45) Date of Patent: Oct. 1, 2019

(54) WAVEFORM SHAPING CIRCUIT, SEMICONDUCTOR DEVICE, AND SWITCHING POWER SUPPLY DEVICE

(71) Applicant: FUJITSU LIMITED, Kawasaki-shi, Kanagawa (JP)

(72) Inventor: Tatsuya Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/238,584

(22) Filed: Jan. 3, 2019

(65) Prior Publication Data
US 2019/0229605 A1 Jul. 25, 2019

(30) Foreign Application Priority Data
Jan. 25, 2018 (JP) .................... 2018-010147

(51) Int. Cl.
| | |
|---|---|
| *H02M 1/38* | (2007.01) |
| *H02M 1/08* | (2006.01) |
| *H02M 1/42* | (2007.01) |
| *H02M 1/32* | (2007.01) |
| *H02M 3/335* | (2006.01) |

(52) U.S. Cl.
CPC ............ *H02M 1/08* (2013.01); *H02M 1/32* (2013.01); *H02M 1/4208* (2013.01); *H02M 3/33592* (2013.01)

(58) Field of Classification Search
CPC ........ H02M 1/38; H02M 1/08; H02M 1/4208; H02M 7/537; H03K 17/04123; H03K 17/063

USPC ..... 363/17, 21.04, 44, 95, 97, 131; 323/271, 323/282–290; 327/109, 110, 381, 391, 327/513
See application file for complete search history.

(56) References Cited

U.S. PATENT DOCUMENTS

| | | | |
|---|---|---|---|
| 3,588,729 A * | 6/1971 | Satterfield | H03F 1/52 330/110 |
| 4,575,641 A | 3/1986 | Kolpin | |
| 6,441,596 B1 * | 8/2002 | Inoue | H02M 3/156 323/282 |

(Continued)

FOREIGN PATENT DOCUMENTS

| | | |
|---|---|---|
| JP | 60-9025 | 1/1985 |
| JP | 2012-231347 | 11/2012 |

(Continued)

*Primary Examiner* — Rajnikant B Patel
(74) *Attorney, Agent, or Firm* — Fujitsu Patent Center

(57) ABSTRACT

A waveform shaping circuit includes a first parallel circuit including a first capacitance element and a first resistance element coupled in parallel with each other, a positive pulse voltage being applied to a first terminal of the first capacitance element and a second terminal of the first resistance element, a gate terminal of a field-effect transistor being electrically coupled to a third terminal of the first capacitance element and a fourth terminal of the first resistance element, a first Zener diode having a first anode coupled to the third terminal and the fourth terminal, and a second parallel circuit including a second capacitance element and a second resistance element coupled in parallel with each other, a first cathode of the first Zener diode being coupled to a fifth terminal of the second capacitance element and a sixth terminal of the second resistance element.

8 Claims, 16 Drawing Sheets

(56) References Cited

U.S. PATENT DOCUMENTS

| | | | |
|---|---|---|---|
| 8,395,422 B2* | 3/2013 | Ogawa | H03K 17/04123 |
| | | | 327/109 |
| 10,277,111 B2* | 4/2019 | Chiereghin | H02M 3/156 |
| 2013/0207621 A1* | 8/2013 | Nishibori | G05F 1/70 |
| | | | 323/205 |
| 2015/0131350 A1 | 5/2015 | Isomura et al. | |
| 2018/0159313 A1 | 6/2018 | Hirose | |

FOREIGN PATENT DOCUMENTS

| | | |
|---|---|---|
| JP | 2018-093678 | 6/2018 |
| WO | 2013/157086 | 10/2013 |

* cited by examiner

FIG. 16

| | VH | VL | sw1 | sw2 | sw3 | sw4 |
|---|---|---|---|---|---|---|
| L1 | 3 | -3 | ON | ON | ON | ON |
| L2 | 6 | -3 | ON | ON | ON | OFF |
| | 6 | -3 | ON | ON | OFF | ON |
| | 9 | -3 | ON | ON | OFF | OFF |
| | 3 | -6 | ON | OFF | ON | ON |
| | 6 | -6 | ON | OFF | ON | OFF |
| | 6 | -6 | ON | OFF | OFF | ON |
| | 9 | -6 | ON | OFF | OFF | OFF |
| | 3 | -6 | OFF | ON | ON | ON |
| | 6 | -6 | OFF | ON | ON | OFF |
| | 6 | -6 | OFF | ON | OFF | ON |
| | 9 | -6 | OFF | ON | OFF | OFF |
| | 3 | -9 | OFF | OFF | ON | ON |
| | 6 | -9 | OFF | OFF | ON | OFF |
| | 6 | -9 | OFF | OFF | OFF | ON |
| | 9 | -9 | OFF | OFF | OFF | OFF |

WAVEFORM SHAPING CIRCUIT, SEMICONDUCTOR DEVICE, AND SWITCHING POWER SUPPLY DEVICE

CROSS-REFERENCE TO RELATED APPLICATION

This application is based upon and claims the benefit of priority of the prior Japanese Patent Application No. 2018-10147, filed on Jan. 25, 2018, the entire contents of which are incorporated herein by reference.

FIELD

The embodiments discussed herein are related to a waveform shaping circuit, a semiconductor device, and a switching power supply device.

BACKGROUND

A switching power supply device is used as an alternating current (AC)/direct current (DC) converter or a DC/DC converter.

There is an isolated switching power supply device that electrically insulates a primary side circuit unit (circuit unit on a side that receives power from an AC power supply in the AC/DC converter) and a secondary side circuit unit (circuit unit on a side that outputs a DC voltage in the AC/DC converter) from each other and magnetically couples the primary side circuit unit and the secondary side circuit unit to each other by using a transformer.

When an electric short circuit occurs on either the primary side or the secondary side in the isolated switching power supply device, propagation of an effect of the electric short circuit to the other side may be avoided. For example, an apparatus coupled to the secondary side circuit unit may be protected even when an overvoltage occurs in the primary side circuit unit due to a lightning strike or the like.

In addition, the isolated switching power supply device performs switching operation by turning on or off a switching element coupled to a primary winding of the transformer, and thus changing magnetic energy stored in the transformer.

A transistor is used as the switching element, and is driven by a control circuit. The control circuit outputs a control voltage (gate voltage) for turning on or off the transistor at a given switching frequency to a gate terminal of the transistor. In recent years, a dedicated control integrated circuit (IC) is often used as the control circuit.

There is a field effect transistor (FET) as the transistor used as the switching element. A silicon (Si)-metal-oxide-semiconductor (MOS) FET, for example, is widely used as the FET.

Many control ICs of isolated switching power supply devices assume the use of the Si-MOSFET as the switching element. A gate drive voltage of the Si-MOSFET is 7 to 20 V. The control IC therefore outputs the gate voltage in that range.

Meanwhile, in recent years, a high electronic mobility transistor referred to as a high electron mobility transistor (HEMT) has been developed. As a typical HEMT, there is a GaN-high electron mobility transistor (HEMT) that uses a compound semiconductor of gallium nitride (GaN) having a small on-resistance element. In addition, a normally off type GaN-HEMT is widely used which maintains an off state without a drain current flowing when the gate voltage is at a given level.

The normally off type GaN-HEMT adopts p-type aluminum gallium nitride (AlGaN) directly under a gate electrode. Therefore, a gate driving voltage of the GaN-HEMT is approximately ±4 to 5 V, and the GaN-HEMT has a low gate withstand voltage and a narrow voltage range as compared with the Si-MOSFET. In addition, the normally off type GaN-HEMT has a low threshold voltage of 1 to 2 V, and therefore false firing that causes a turn-on tends to occur when the gate voltage is in the vicinity of 0 V.

Because the GaN-HEMT has a promising characteristic for highly efficient power conversion, for example, application of the GaN-HEMT as the switching element of a switching power supply device is under investigation.

Incidentally, a technology is proposed which suppresses a positive side overvoltage in a switching power supply device using GaN as a switching element.

However, for example, because the gate driving voltage of the GaN-HEMT has the characteristic as described above, it is difficult to drive the GaN-HEMT by the control IC that assumes the use of the Si-MOSFET. For example, although a negative gate voltage is desired to be applied to turn off the normally off type GaN-HEMT reliably, there is a possibility of occurrence of an overvoltage on a negative side. Incidentally, such a problem may occur in the GaN-HEMT, besides, also in other FETs whose threshold voltage is becoming lower.

The followings are reference documents.
[Document 1] Japanese Patent No. 6160762 and
[Document 2] International Publication Pamphlet No. WO 2013/157086.

SUMMARY

According to an aspect of the embodiments, a waveform shaping circuit includes a first parallel circuit including a first capacitance element and a first resistance element coupled in parallel with each other, a positive pulse voltage being applied to a first terminal of the first capacitance element and a second terminal of the first resistance element, a gate terminal of a field-effect transistor being electrically coupled to a third terminal of the first capacitance element and a fourth terminal of the first resistance element, a first Zener diode having a first anode coupled to the third terminal and the fourth terminal, and a second parallel circuit including a second capacitance element and a second resistance element coupled in parallel with each other, a first cathode of the first Zener diode being coupled to a fifth terminal of the second capacitance element and a sixth terminal of the second resistance element, and a seventh terminal of the second capacitance element and an eighth terminal of the second resistance element being at a reference potential.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 16 is a diagram illustrating an example of control of a gate voltage based on switching.

DESCRIPTION OF EMBODIMENTS

A mode for carrying out a technology will hereinafter be described with reference to the drawings.

First Embodiment

Figure 1:
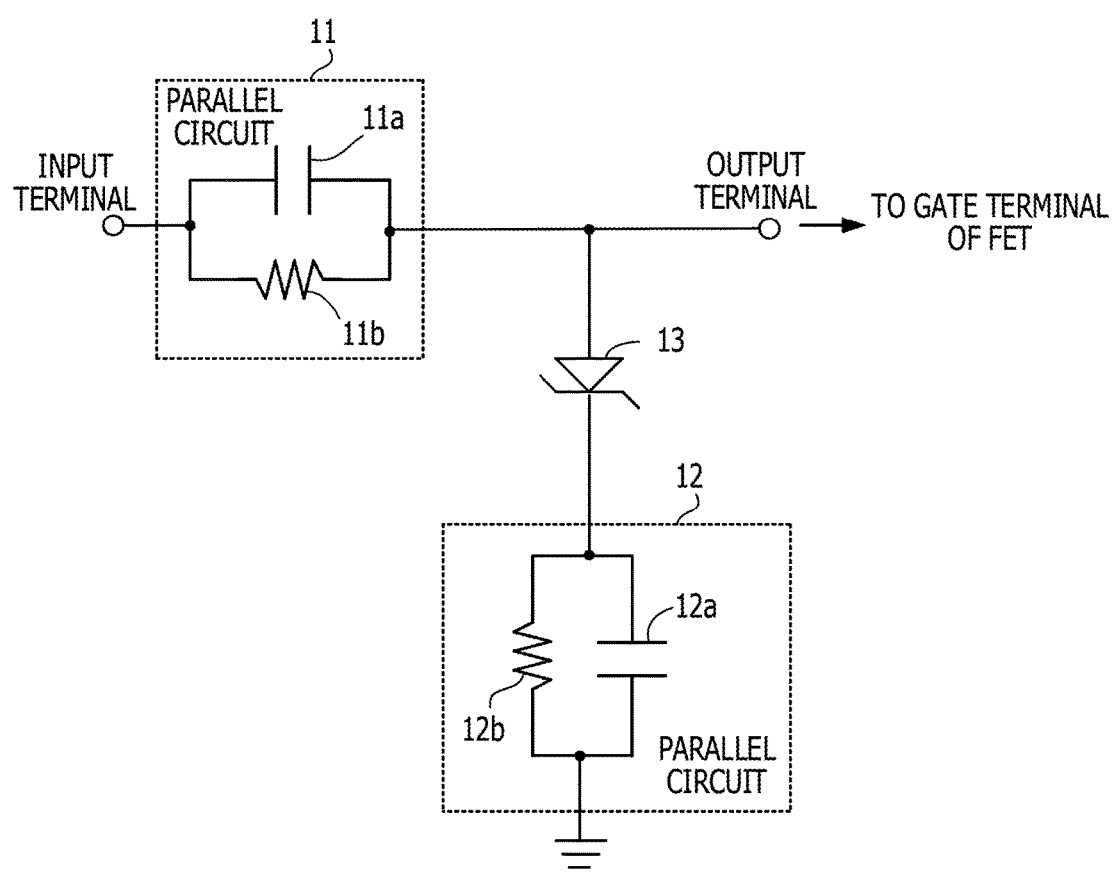
FIG. 1 is a diagram illustrating an example of a waveform shaping circuit according to a first embodiment.

FIG. 1 is a diagram illustrating an example of a waveform shaping circuit according to a first embodiment. A waveform shaping circuit 10-1 is a circuit capable of supplying a negative gate voltage to a gate terminal of a FET by waveform shaping. The waveform shaping circuit 10-1 includes a parallel circuit 11, a parallel circuit 12, and a Zener diode 13. The parallel circuit 11 includes a capacitor 11a and a resistance element 11b. The parallel circuit 12 includes a capacitor 12a and a resistance element 12b.

In coupling relation of each circuit element, one terminal of the capacitor 11a and one terminal of the resistance element 11b are coupled to an input terminal of the waveform shaping circuit 10-1. Another terminal of the capacitor 11a and another terminal of the resistance element 11b are coupled to an anode of the Zener diode 13, and are electrically coupled to the gate terminal of the FET not illustrated in the figure via an output terminal of the waveform shaping circuit 10-1. The other terminal of the capacitor 11a and the other terminal of the resistance element 11b do not have to be directly coupled to the gate terminal of the FET, but may, for example, be coupled to the gate terminal of the FET via a resistance or the like. A similar is true also in each embodiment to be described in the following.

The FET is, for example, a normally off type GaN-HEMT having a low threshold voltage of 1 to 2 V, as described earlier. However, the FET may be a normally off type GaN-HEMT, besides, may be a compound such as a Si-MOSFET, a gallium arsenide (GaAs)-MOSFET, or the like.

Incidentally, the output terminal of the waveform shaping circuit 10-1 does not have to be directly coupled to the gate terminal of the FET, but may be coupled to the gate terminal of the FET via a resistance element, an inductance element, or the like.

A cathode of the Zener diode 13 is coupled to one terminal of the capacitor 12a and one terminal of the resistance element 12b. Another terminal of the capacitor 12a and another terminal of the resistance element 12b are coupled to an element at a reference potential (hereinafter referred to as a GND).

Here, in a case where an input voltage Vin as a positive pulse voltage is input to the input terminal, when Vin>0, a current flows through the parallel circuit 11, and a parasitic capacitance of the Zener diode 13 induces a charge in the parallel circuit 12. In addition, when a voltage across the Zener diode 13 exceeds a forward voltage, a current flows through the parallel circuit 12. When the input voltage Vin drops to 0 V, the current discharged from the parallel circuit 12 to an input terminal side or an output terminal side is interrupted by the Zener diode 13.

At this time, to compensate for a charge accumulated on the capacitor 11a side, a current flows from the output terminal side to the input terminal side, and a voltage on the output terminal side tends to a negative. When the output terminal tries to become lower than a given voltage on a negative side, a lower limit value is limited by a Zener voltage (referred to also as a breakdown voltage) of the Zener diode 13, and the voltage on the negative side of the output terminal is determined. For example, because the Zener voltage of the Zener diode 13 becomes a fixed voltage on the negative side, an overvoltage on the negative side is suppressed without becoming lower than the Zener voltage.

Thus, the waveform shaping circuit 10-1 has the two parallel circuits 11 and 12 coupled between the input terminal and the GND via the Zener diode 13 whose anode is coupled to the gate terminal of the FET. This makes it possible to limit the negative voltage to the Zener voltage of the Zener diode 13, and thus suppress an overvoltage on the negative side.

Comparative Examples

In the following, examples of a voltage converting circuit that generates a negative voltage will be illustrated as comparative examples for comparison with the waveform shaping circuit 10-1 according to the first embodiment.

Figure 2:
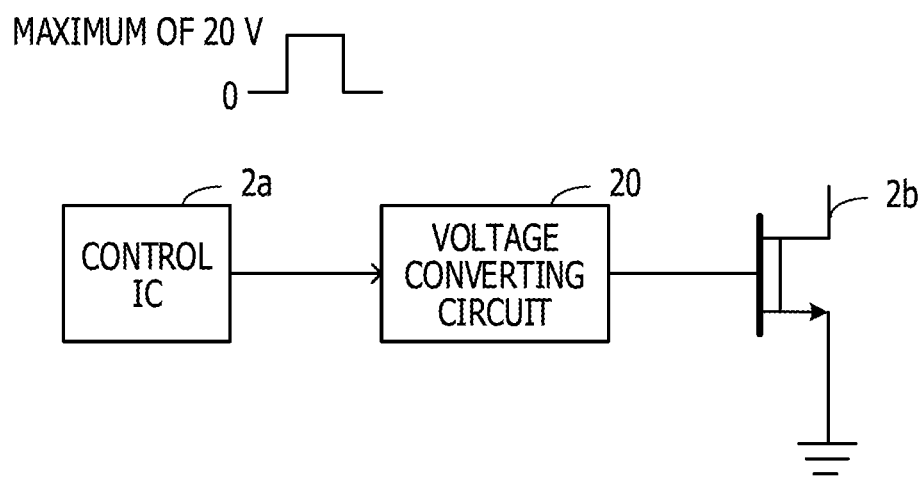
FIG. 2 is a diagram illustrating an example of a mode of coupling of a control IC of a switching power supply device, a voltage converting circuit, and a GaN-HEMT.

FIG. 2 is a diagram illustrating an example of a mode of coupling of a control IC of a switching power supply device, a voltage converting circuit, and a GaN-HEMT. A voltage converting circuit 20 is located between a control IC 2a of a switching power supply device and a normally off type GaN-HEMT 2b as a switching element. The voltage converting circuit 20 converts a control voltage (a maximum of 20 V) output from the control IC 2a to a given voltage, and applies the voltage after the conversion as a gate voltage to a gate terminal of the GaN-HEMT 2b.

Figure 3:
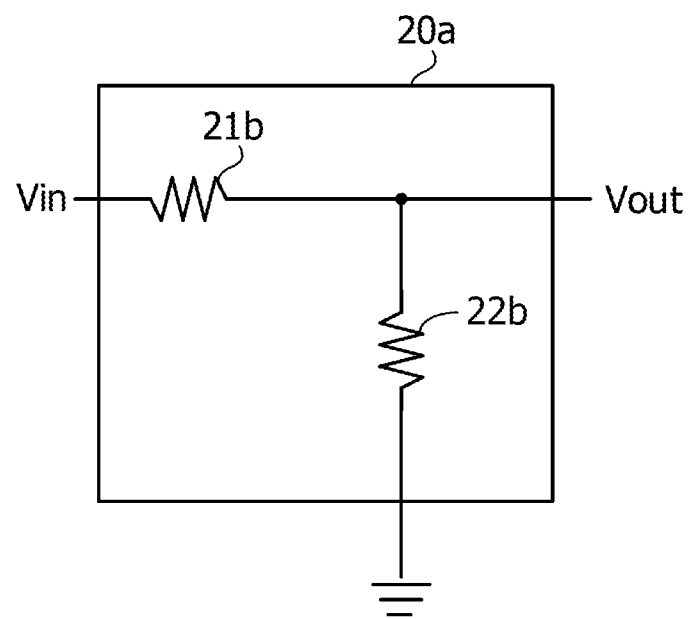
FIG. 3 is a diagram illustrating an example of a voltage converting circuit (resistance division type)

FIG. 3 is a diagram illustrating an example of a voltage converting circuit. A voltage converting circuit 20a represents a case where the voltage converting circuit 20 illustrated in FIG. 2 is a circuit of a resistance division type. The voltage converting circuit 20a converts an input voltage Vin to a given voltage Vout by resistance division, and outputs the voltage Vout.

The voltage converting circuit 20a includes resistance elements 21b and 22b. The input voltage Vin is applied to one terminal of the resistance element 21b. Another terminal of the resistance element 21b and one terminal of the resistance element 22b are coupled to each other. Another terminal of the resistance element 22b is coupled to a GND. In addition, a voltage Vout is output through a point of coupling between the resistance elements 21b and 22b.

A maximum value of the voltage Vout is calculated by the following Equation (1). In Equation (1), R1 is a resistance value of the resistance element 21b, and R2 is a resistance value of the resistance element 22b.

$$Vout=R2 \cdot Vin/(R1+R2) \qquad (1)$$

In the voltage converting circuit 20a of the resistance division type, when an input voltage Vin as a positive pulse voltage is input, for example, the resistance values of the resistance elements 21b and 22b are set small to suppress waveform rounding of the voltage Vout. However, as the respective resistance values of the resistance elements 21b and 22b become smaller, currents flowing through the resistance elements 21b and 22b are increased, and therefore a power loss is increased.

In addition, the waveform rounding of the voltage Vout also depends on an output load (the waveform rounding of the voltage Vout changes according to a time constant of an input capacitance of the output load and a combined resistance of the resistance elements 21b and 22b).

Further, the output voltage Vout changes according to a change in the input voltage Vin. For example, when the input voltage Vin increases to a positive side, the output voltage Vout also increases to the positive side, and when the input voltage Vin increases to the negative side, the output voltage Vout also increases to the negative side. Thus, it is difficult for the voltage converting circuit 20a to limit overvoltages on the positive side and the negative side of the voltage Vout. The voltage converting circuit 20a is therefore not suitable for driving a load such as the GaN-HEMT 2b or the like.

Figure 4:
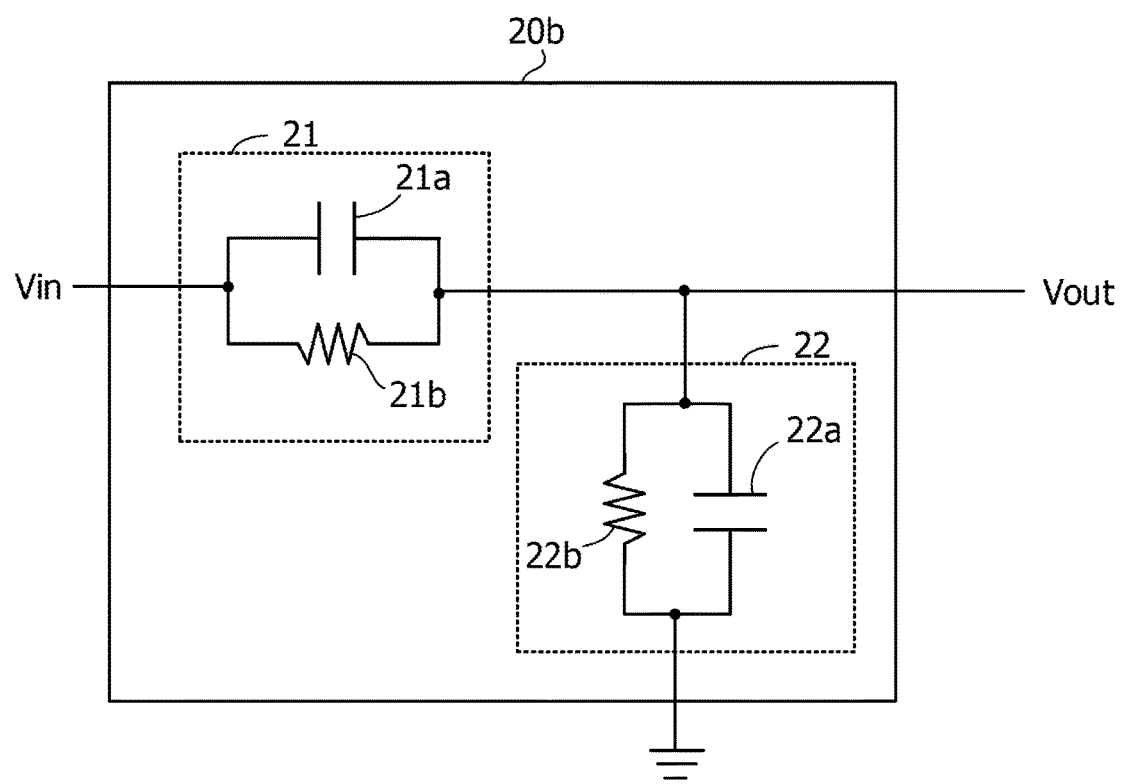
FIG. 4 is a diagram illustrating an example of a voltage converting circuit (waveform shaping type)

FIG. 4 is a diagram illustrating an example of a voltage converting circuit. A voltage converting circuit 20b represents a case where the voltage converting circuit 20 illustrated in FIG. 2 is a circuit of a waveform shaping type. The voltage converting circuit 20b converts an input voltage Vin to a given voltage Vout by waveform shaping, and outputs the voltage Vout.

The voltage converting circuit 20b includes parallel circuits 21 and 22. The parallel circuit 21 includes a capacitor 21a and a resistance element 21b. The parallel circuit 22 includes a capacitor 22a and a resistance element 22b.

One terminal of the resistance element 21b is coupled to one terminal of the capacitor 21a. The input voltage Vin is applied to the one terminal of the resistance element 21b and the one terminal of the capacitor 21a. Another terminal of the resistance element 21b is coupled to another terminal of the capacitor 21a, one terminal of the resistance element 22b, and one terminal of the capacitor 22a. Another terminal of the resistance element 22b is coupled to another terminal of the capacitor 22a and a GND. In addition, a voltage Vout is output through a point of coupling between the parallel circuits 21 and 22.

In the voltage converting circuit 20b of the waveform shaping type, a maximum output value of the voltage Vout may be adjusted according to resistance values of the resistance elements 21b and 22b and capacitances of the capacitors 21a and 22a. In addition, even when the resistance values of the resistance elements 21b and 22b are increased to reduce a power loss, the waveform may be adjusted according to relation between the resistance element 21b and the capacitor 21a and the resistance element 22b and the capacitor 22a.

However, also in the voltage converting circuit 20b, as in the voltage converting circuit 20a described above, the output voltage Vout changes according to a change in the input voltage Vin. For example, when the input voltage Vin increases to the positive side, the output voltage Vout also increases to the positive side, and when the input voltage Vin increases to the negative side, the output voltage Vout also increases to the negative side. Thus, it is difficult for the voltage converting circuit 20b to limit overvoltages on the positive side and the negative side of the voltage Vout. The voltage converting circuit 20b is therefore not suitable for driving a load such as the GaN-HEMT 2b or the like.

Figure 5:
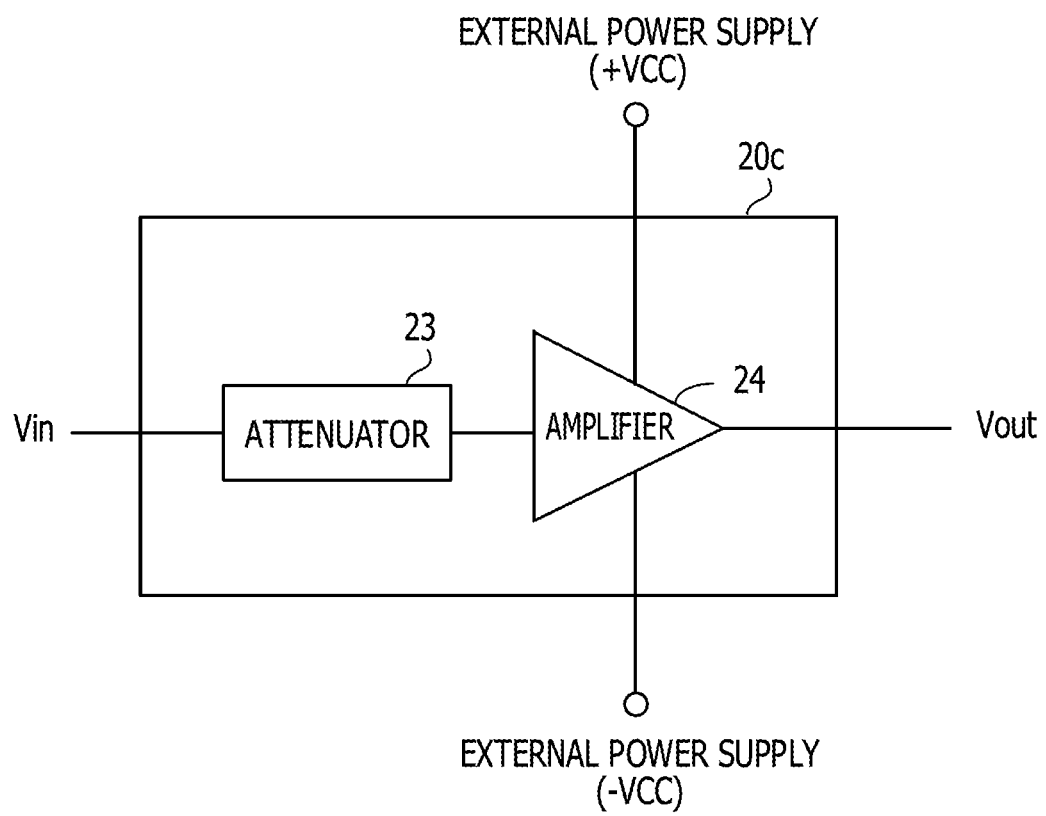
FIG. 5 is a diagram illustrating an example of a voltage converting circuit (dedicated driver)

FIG. 5 is a diagram illustrating an example of a voltage converting circuit. A voltage converting circuit 20c represents a case where a dedicated driver is used in the voltage converting circuit 20 illustrated in FIG. 2. The voltage converting circuit 20c converts an input voltage Vin to a given voltage Vout by the dedicated driver, and outputs the voltage Vout.

The voltage converting circuit 20c includes an attenuator 23 and an amplifier 24 as the dedicated driver. External power supply voltages (+VCC and −VCC) are applied to the amplifier 24. In addition, there is a limitation to the input voltage in the voltage converting circuit 20c using the dedicated driver, and therefore the attenuator 23 attenuates the level of the input voltage Vin to a certain level. The amplifier 24 amplifies the voltage output from the attenuator 23 to a given level, and outputs the amplified voltage.

A minimum value and a maximum value of the voltage Vout in the voltage converting circuit 20c using the dedicated driver may be set by external power supplies. However, circuits of the positive and negative external power supplies for outputting the given power supply voltages are needed, so that a circuit scale is increased. In addition, the voltage converting circuit 20c is a circuit manufactured so as to be specialized in driving an output side load, and therefore entails high cost.

As described above, the voltage converting circuit 20a (the resistance division type in FIG. 3) and the voltage converting circuit 20b (the waveform shaping type in FIG. 4) are unsuitable for use in driving the GaN-HEMT 2b. In addition, the use of the voltage converting circuit 20c (the dedicated driver in FIG. 5) increases the circuit scale and entails high cost.

In contrast to the voltage converting circuits 20a, 20b, and 20c as described above, the waveform shaping circuit 10-1 according to the first embodiment may suppress an overvoltage on the negative side, as described earlier, and does not need the dedicated driver, so that an increase in cost is avoided.

Second Embodiment

Figure 6:
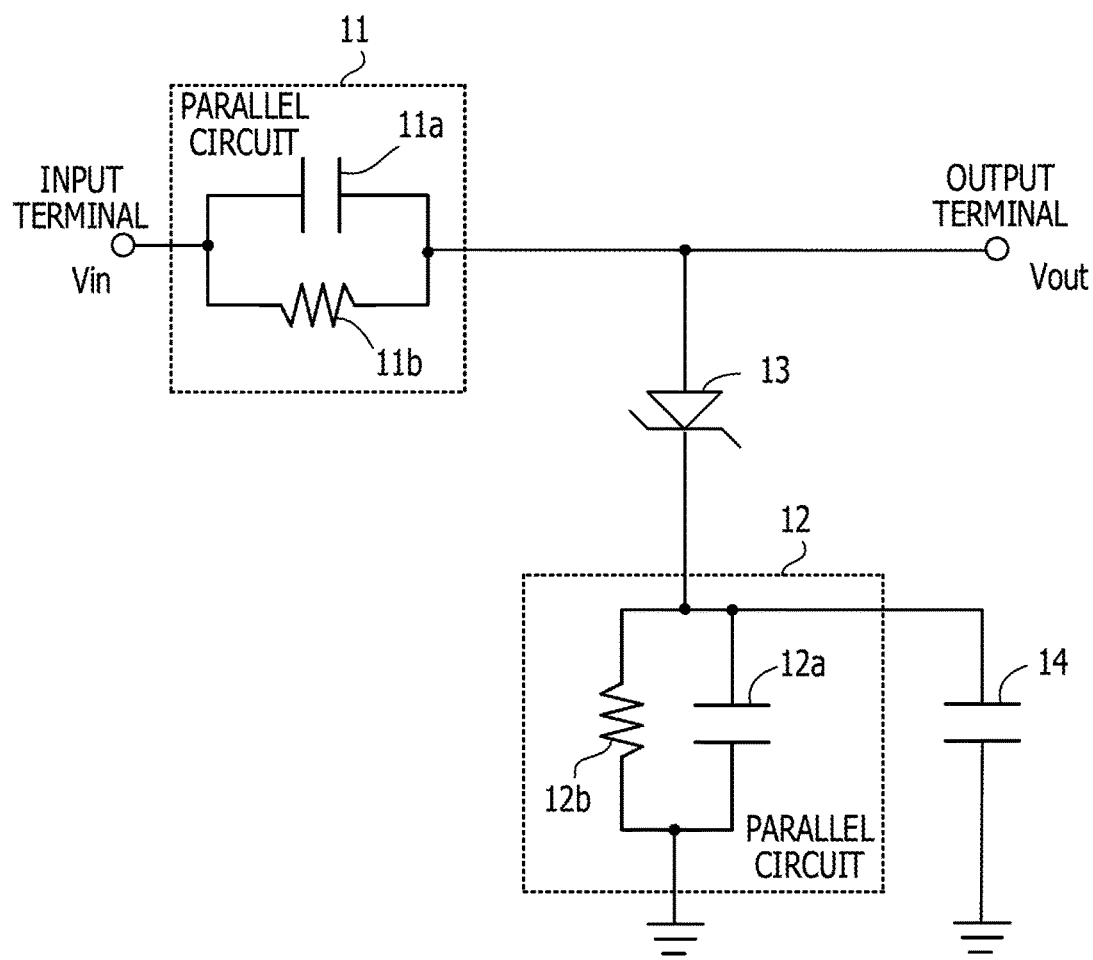
FIG. 6 is a diagram illustrating an example of a waveform shaping circuit according to a second embodiment.

FIG. 6 is a diagram illustrating an example of a waveform shaping circuit according to a second embodiment. In FIG. 6, the same elements as in the waveform shaping circuit 10-1 according to the first embodiment illustrated in FIG. 1 are identified by the same reference numerals. A waveform shaping circuit 10-2 includes a capacitor 14 in addition to each element of the waveform shaping circuit 10-1. However, the capacitor 14 is an example of a nonlinear element where a flowing current changes nonlinearly in response to a change in an applied voltage, and is a nonlinear element in which a slope of increase in capacitance value increases with an increase in the applied voltage. Usable as such a capacitor 14 is, for example, a PN junction diode, a MOS diode, a Schottky diode, and the like.

One terminal of the capacitor 14 is coupled to the cathode of the Zener diode 13, one terminal of the resistance element 12b, and one terminal of the capacitor 12a. Another terminal of the capacitor 14 is coupled to the GND.

In such a waveform shaping circuit 10-2, in a case where a pulsed voltage Vin is input to the input terminal, when Vin>0, a current flows through the parallel circuit 11, and a parasitic capacitance of the Zener diode 13 induces a charge in the parallel circuit 12. In addition, when a voltage across the Zener diode 13 exceeds a forward voltage, a current flows through the parallel circuit 12. When a voltage across the capacitor 12a then rises, due to an action of the capacitor 14, a large amount of current flows through the capacitor 14, and a rise in voltage applied to the parallel circuit 12 is stopped. For example, the voltage applied to the parallel circuit 12 is limited so as not to become equal to or higher than a given voltage, and thus the occurrence of an overvoltage on the positive side of Vout is suppressed.

An operation when Vin drops to zero is the same as the operation of the waveform shaping circuit 10-1 according to the first embodiment, and the occurrence of an overvoltage on the negative side of Vout is suppressed.

Figure 7:
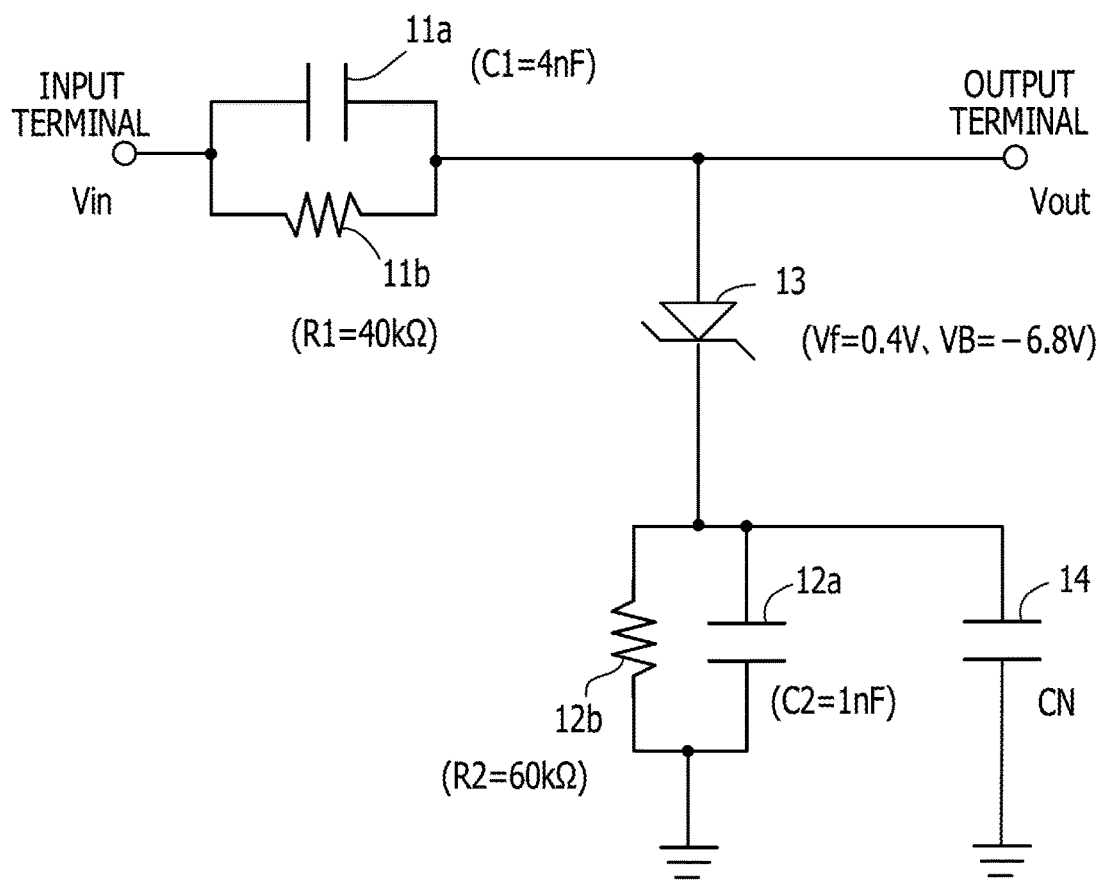
FIG. 7 is a diagram illustrating an example of values of respective elements of a waveform shaping circuit.

FIG. 7 is a diagram illustrating an example of values of respective elements of a waveform shaping circuit. Suppose that a capacitance C1 of the capacitor 11a is 4 nF, that a resistance value R1 of the resistance element 11b is 40 kΩ, that a capacitance C2 of the capacitor 12a is 1 nF, and that a resistance value R2 of the resistance element 12b is 60 kΩ. In addition, suppose that a forward voltage Vf of the Zener diode 13 is 0.4 V, and that a Zener voltage BV of the Zener diode 13 is −6.8 V.

In addition, a capacitance CN of the capacitor 14 is calculated by dQ/dV. Q is an amount of charge accumulated in the capacitor 14, and is calculated by the following Equation (2).

$$Q = C0 \times b \times \ln(1+\exp(-(V-a)/b)) + BV \times \ln(1+\exp(1/b \times a)) \quad (2)$$

Incidentally, suppose that the respective parameter values of C0, a, and b in Equation (2) are a=3.5, b=0.1, and $C0=330E^{-6}$.

Figure 8:
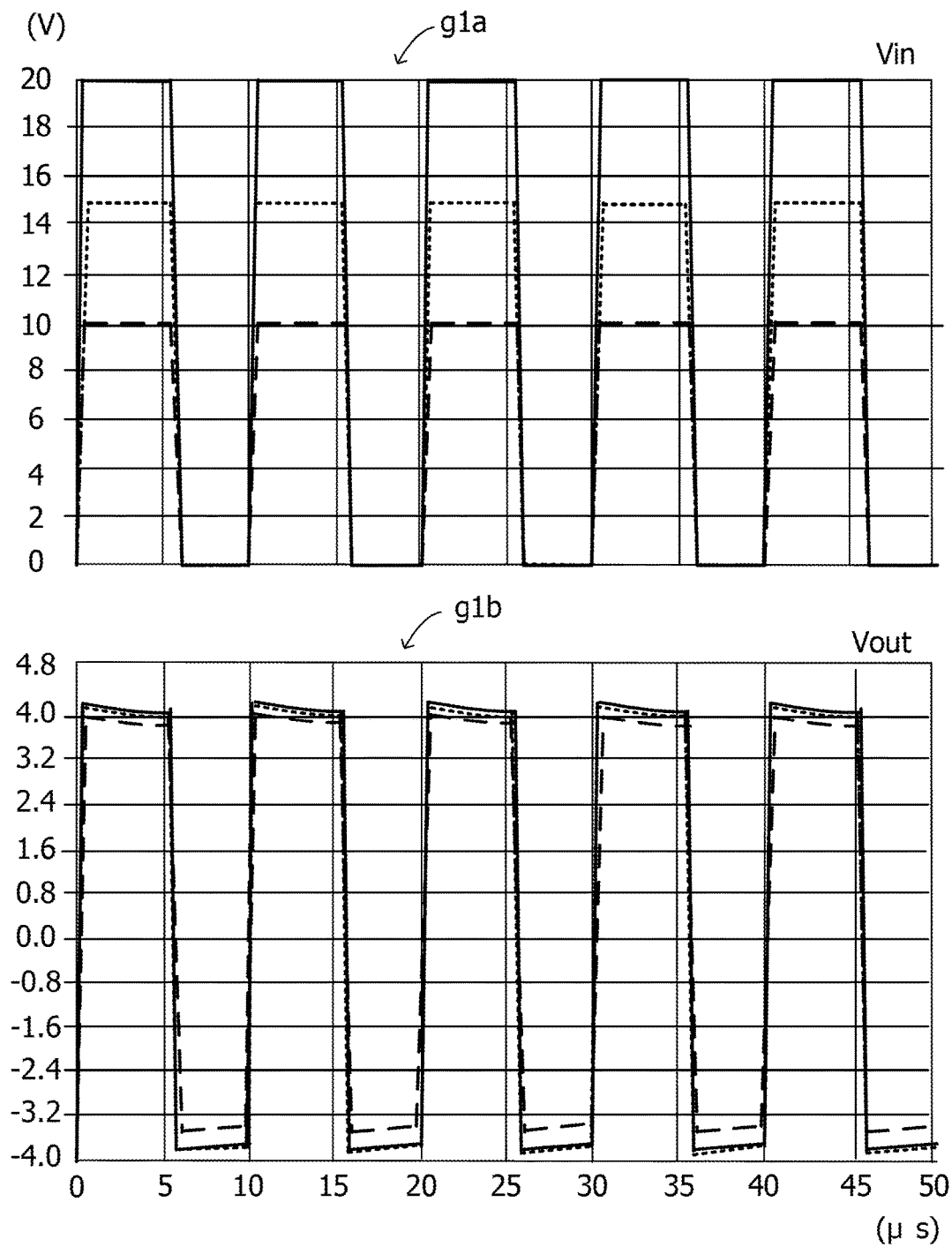
FIG. 8 is a diagram illustrating an example of a simulation result.

FIG. 8 is a diagram illustrating an example of a simulation result. FIG. 8 illustrates a simulation result when a simulation was performed with the values of the circuit elements illustrated in FIG. 7.

A waveform graph g1a represents the waveform of the input voltage Vin. In the waveform graph g1a, an axis of abscissas indicates time (μs), and an axis of ordinates indicates the input voltage Vin (V). A waveform graph g1b represents the waveform of the output voltage Vout. In the waveform graph g1b, an axis of abscissas indicates time (μs), and an axis of ordinates indicates the output voltage Vout (V).

It is clear that even when the positive side peak value of the input voltage Vin as a positive pulse voltage is increased to 10 V, 15 V, and 20 V, the positive side voltage of the waveform of the output voltage Vout is limited in the vicinity of 4.0 V, and the negative side voltage of the waveform of the output voltage Vout is limited within a range of −3.2 to −4.0 V. Further, waveform rounding of the waveform of the output voltage Vout is suppressed, and the waveform of the output voltage Vout is in a voltage range of −4 to +4 V. Thus, it is clear that overvoltages on the positive side and the negative side of the output voltage Vout are suppressed, and that a voltage range suitable for a GaN-HEMT whose gate driving voltage is, for example, approximately ±4 to 5 V may be achieved.

Third Embodiment

Figure 9:
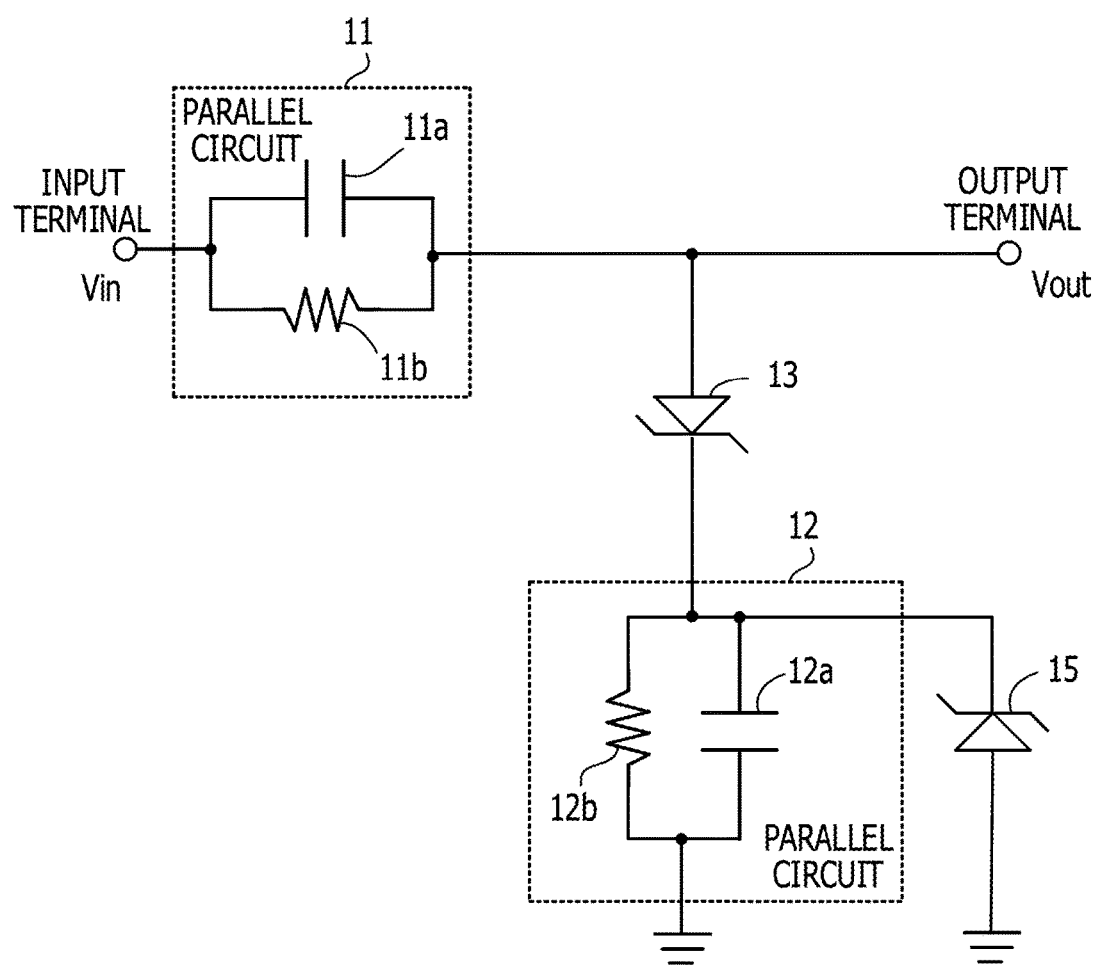
FIG. 9 is a diagram illustrating an example of a waveform shaping circuit according to a third embodiment.

FIG. 9 is diagram illustrating an example of a waveform shaping circuit according to a third embodiment. In FIG. 9, the same elements as in the waveform shaping circuit 10-1 according to the first embodiment illustrated in FIG. 1 are identified by the same reference numerals. A waveform shaping circuit 10-3 includes, in addition to each element of the waveform shaping circuit 10-1, a Zener diode 15 as an example of a nonlinear element where a flowing current changes nonlinearly in response to a change in an applied voltage.

A cathode of the Zener diode 15 is coupled to one terminal of the capacitor 12a, one terminal of the resistance element 12b, and the cathode of the Zener diode 13. An anode of the Zener diode 15 is coupled to the GND.

In such a waveform shaping circuit 10-3, in a case where a pulsed voltage Vin is input to the input terminal, when Vin>0, a current flows through the parallel circuit 11, and a parasitic capacitance of the Zener diode 13 induces a charge in the parallel circuit 12. In addition, when a voltage across the Zener diode 13 exceeds a forward voltage, a current flows through the parallel circuit 12. Then, when a voltage across the capacitor 12a rises, and a voltage across the Zener diode 15 falls below a Zener voltage, a current flows to the GND side via the Zener diode 15. A rise in a voltage applied to the parallel circuit 12 is thereby stopped. For example, the voltage applied to the parallel circuit 12 is limited so as not to become equal to or higher than a given voltage, and the occurrence of an overvoltage on the positive side of Vout is suppressed.

An operation when Vin drops to zero is the same as the operation of the waveform shaping circuit 10-1 according to the first embodiment, and the occurrence of an overvoltage on the negative side of Vout is suppressed.

Figure 10:
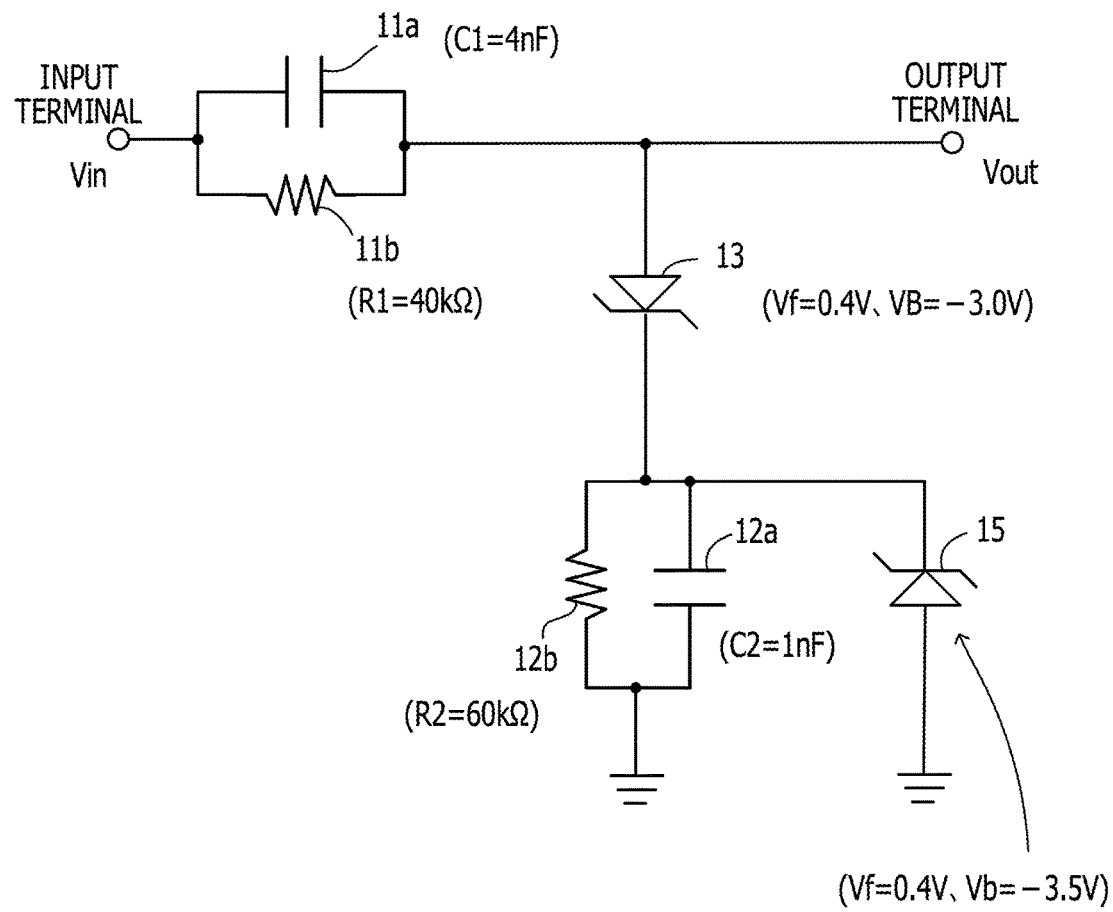
FIG. 10 is a diagram illustrating an example of values of respective elements of a waveform shaping circuit.

FIG. 10 is a diagram illustrating an example of values of respective elements of a waveform shaping circuit. Suppose that a capacitance C1 of the capacitor 11a is 4 nF, that a resistance value R1 of the resistance element 11b is 40 kΩ, that a capacitance C2 of the capacitor 12a is 1 nF, and that a resistance value R2 of the resistance element 12b is 60 kΩ. In addition, suppose that a forward voltage Vf of the Zener diode 13 is 0.4 V, that a Zener voltage BV of the Zener diode 13 is −3.0 V, that a forward voltage Vf of the Zener diode 15 is 0.4 V, and that a Zener voltage BV of the Zener diode 15 is −3.5 V.

Figure 11:
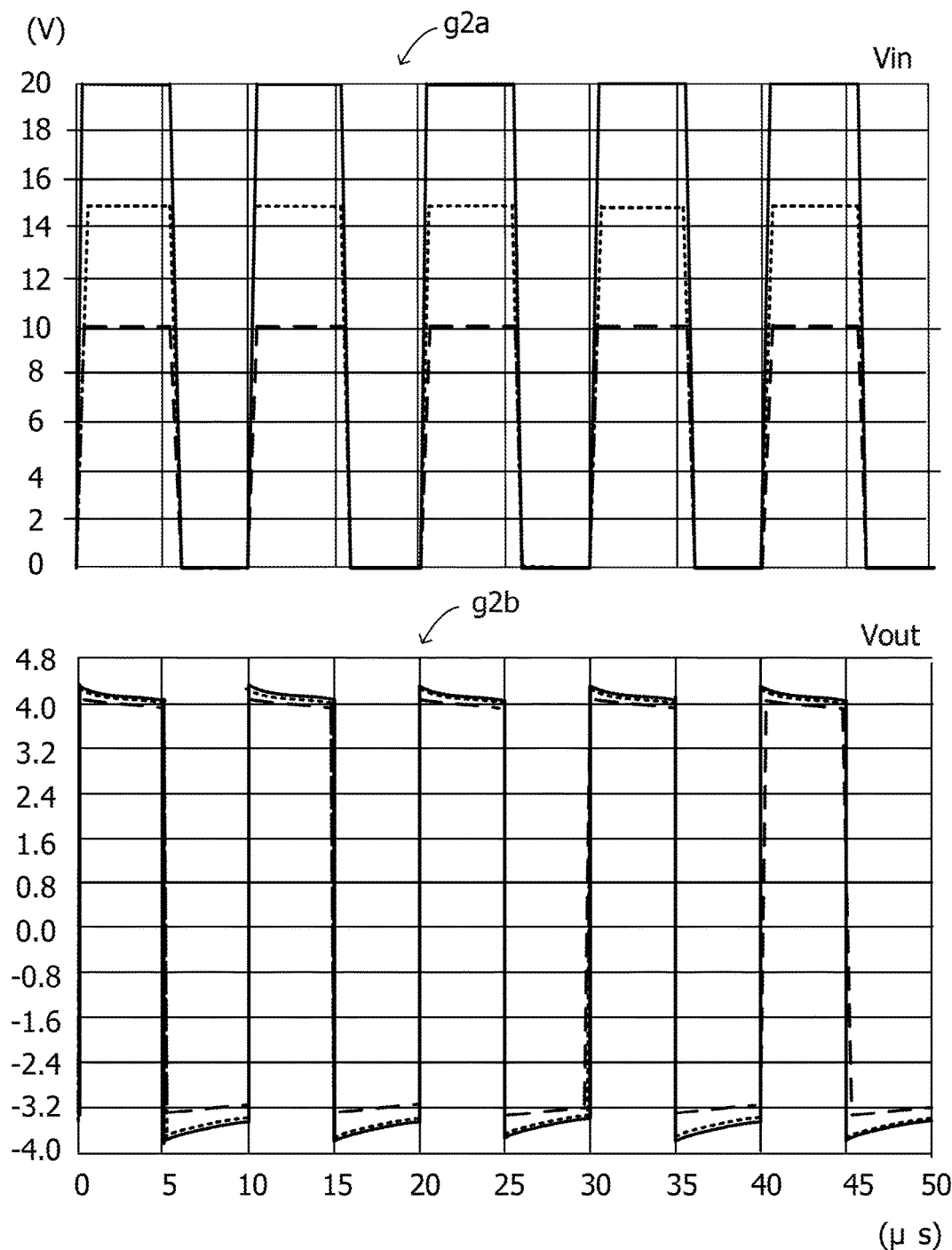
FIG. 11 is a diagram illustrating an example of a simulation result.

FIG. 11 is a diagram illustrating an example of a simulation result. FIG. 11 illustrates a simulation result when a simulation was performed with the values of the circuit elements illustrated in FIG. 10.

A waveform graph g2a represents the waveform of the input voltage Vin. In the waveform graph g2a, an axis of abscissas indicates time (μs), and an axis of ordinates indicates the input voltage Vin (V). A waveform graph g2b represents the waveform of the output voltage Vout. In the waveform graph g2b, an axis of abscissas indicates time (μs), and an axis of ordinates indicates the output voltage Vout (V).

It is clear that even when the positive side peak value of the pulsed input voltage Vin is increased to 10 V, 15 V, and 20 V, the positive side voltage of the waveform of the output voltage Vout is limited in the vicinity of 4.0 V, and the negative side voltage of the waveform of the output voltage Vout is limited within a range of −3.2 to −4.0 V. Further, waveform rounding of the waveform of the output voltage Vout is suppressed, and the waveform of the output voltage Vout is in a voltage range of −4 to +4 V. Thus, it is clear that overvoltages on the positive side and the negative side of the output voltage Vout are suppressed, and that a voltage range suitable for a GaN-HEMT whose gate driving voltage is, for example, approximately ±4 to 5 V may be achieved.

(Examples of Application of Waveform Shaping Circuits to Semiconductor Devices) Examples of application of the waveform shaping circuits as described above to semiconductor devices will be illustrated in the following. In the following, a switching power supply device, a PFC (power-factor improvement) device, and a server power supply device are cited as an example of the semiconductor devices.

Figure 12:
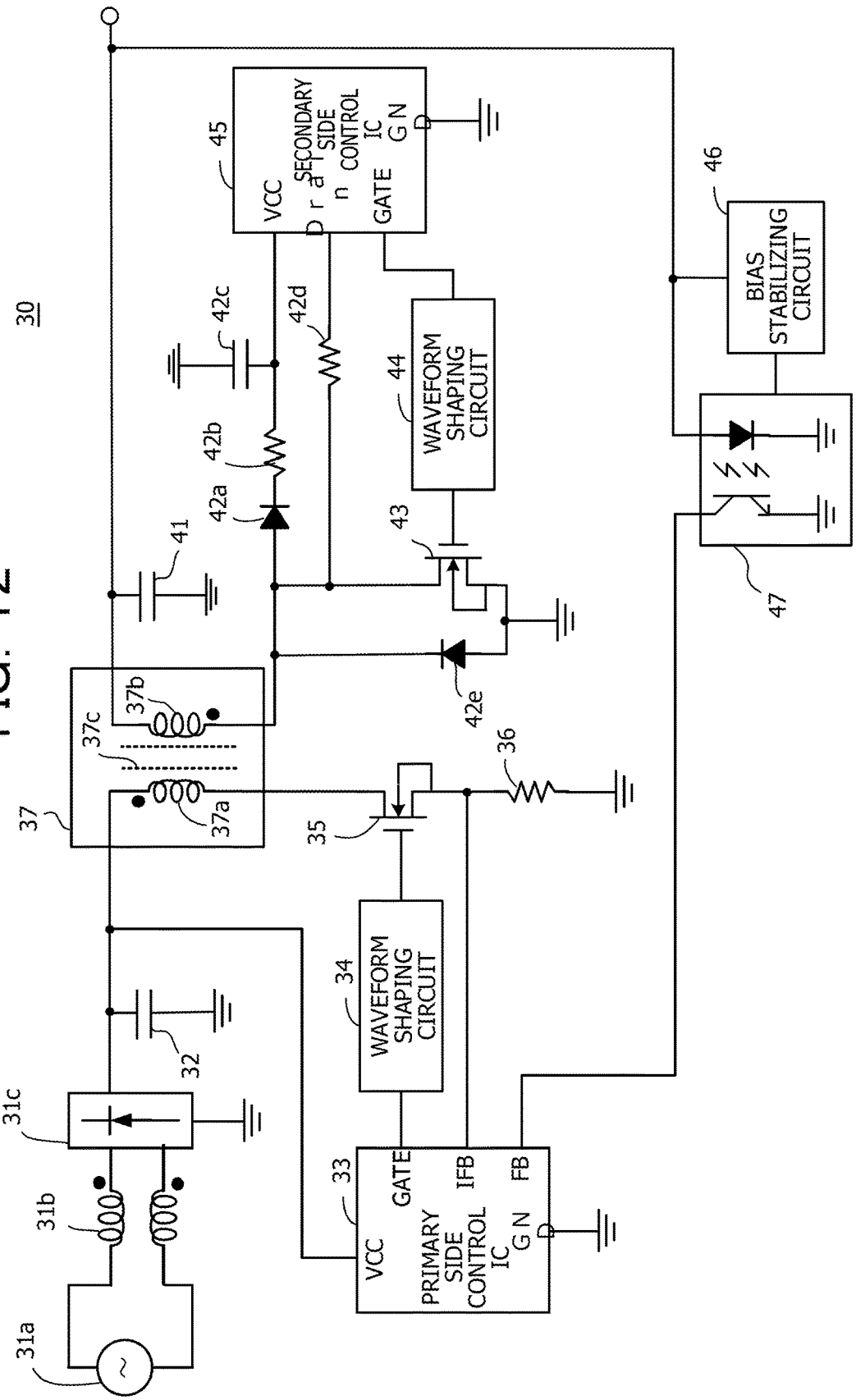
FIG. 12 is a diagram illustrating an example of a switching power supply device.

FIG. 12 is a diagram illustrating an example of a switching power supply device. A switching power supply device 30 is illustrated as an example of a semiconductor device to which a waveform shaping circuit described above is applied. The switching power supply device 30 may be used as an AC adapter.

A primary side circuit unit of the switching power supply device 30 includes a common mode filter 31b, a diode bridge 31c, a capacitor 32, a primary side control IC 33, a waveform shaping circuit 34, a transistor 35, and a resistance element 36.

In addition, the switching power supply device 30 includes a transformer 37 that electrically insulates the primary side circuit unit and a secondary side circuit unit from each other, and magnetically couples the primary side circuit unit and the secondary side circuit unit to each other.

The secondary side circuit unit includes capacitors 41 and 42c, resistance elements 42b and 42d, diodes 42a and 42e, a transistor 43, a waveform shaping circuit 44, and a secondary side control IC 45. The switching power supply device 30 further includes a bias stabilizing circuit 46 and a photocoupler 47. Incidentally, the transistors 35 and 43 are an n-channel MOSFET, and are, for example, a normally off type GaN-HEMT.

The common mode filter 31b is coupled to an alternating-current power supply 31a, and filters out a harmonic noise from an alternating-current voltage. The diode bridge 31c rectifies the alternating-current voltage after the noise removal, and outputs a rectified signal. The capacitor 32 smoothes the rectified signal output by the diode bridge 31c.

When a power supply voltage reaches an operable voltage, the primary side control IC 33 outputs a control voltage (control signal) for controlling switching operation of the transistor 35. In addition, the primary side control IC 33 includes a VCC terminal, a GATE terminal, an IFB terminal, an FB terminal, and a GND terminal.

The VCC terminal is a terminal to which the power supply voltage of the primary side control IC 33 is applied. The VCC terminal is coupled with one terminal of the capacitor 32, an output terminal of the diode bridge 31c, and one terminal of a primary winding 37a of the transformer 37. Another terminal of the capacitor 32 is coupled to a GND.

The GATE terminal is a terminal from which the control voltage for switching the transistor 35 is output. The GATE terminal is coupled to an input terminal of the waveform shaping circuit 34.

The IFB terminal is a terminal for performing feedback detection of a current flowing from a drain terminal to a source terminal of the transistor 35. The IFB terminal is coupled to the source terminal of the transistor 35 and one terminal of the resistance element 36. Another terminal of the resistance element 36 is coupled to the GND. Incidentally, when the current input to the IFB terminal is an abnormal value, the primary side control IC 33, for example, stops the switching operation of the transistor 35 by setting the control voltage output from the GATE terminal to a given level.

The FB terminal is a terminal that receives a feedback voltage output from the photocoupler 47. Based on the feedback voltage, the primary side control IC 33 adjusts a duty ratio to an appropriate value so that an output voltage is held uniform. The GND terminal is coupled to the GND.

When the waveform shaping circuit 34 receives the control voltage output from the primary side control IC 33, the waveform shaping circuit 34 converts the control voltage into an operating voltage range suitable for the transistor 35, and outputs a voltage signal after the conversion as a gate voltage. The waveform shaping circuit 10-2 or the waveform shaping circuit 10-3 described above, for example, is used as the waveform shaping circuit 34.

The transistor 35 includes the drain terminal coupled to the primary winding 37a of the transformer 37, the source terminal coupled to the GND via the resistance element 36, and a gate terminal to which the gate voltage output from the waveform shaping circuit 34 is applied. The transistor 35 is turned on or off according to the gate voltage supplied from the waveform shaping circuit 34.

Incidentally, in a case where the transistor 35 is a normally off type GaN-HEMT, when the waveform shaping circuit 34 turns on the transistor 35, the waveform shaping circuit 34 applies a positive side voltage as an on voltage signal to the gate terminal of the transistor 35. In addition, when the waveform shaping circuit 34 turns off the transistor 35, the waveform shaping circuit 34 applies a negative side voltage as an off voltage signal to the gate terminal of the transistor 35.

The transformer 37 includes the primary winding 37a, a secondary winding 37b, and a core 37c. Though schematically illustrated in FIG. 12, the primary winding 37a and the secondary winding 37b are wound around the core 37c. Incidentally, a black dot illustrated in the vicinity of one terminal of each winding indicates a winding start position of each winding.

One terminal of the primary winding 37a is coupled to the output terminal of the diode bridge 31c, the one terminal of the capacitor 32, and the VCC terminal of the primary side control IC 33. Another terminal of the primary winding 37a is coupled to the drain terminal of the transistor 35.

One terminal of the secondary winding 37b is coupled to one terminal of the capacitor 41 and an output terminal of the switching power supply device 30. Another terminal of the capacitor 41 is coupled to the GND. The capacitor 41 is provided to reduce a ripple voltage occurring in the output voltage.

Another terminal of the secondary winding 37b is coupled to an anode of the diode 42a, one terminal of the resistance element 42d, a drain terminal of the transistor 43, and a cathode of the diode 42e.

The transistor 43 includes the drain terminal coupled to the one terminal of the secondary winding 37b, a source terminal coupled to the GND, and a gate terminal to which a gate voltage supplied from the waveform shaping circuit 44 is applied. The transistor 43 performs switching operation based on the gate voltage.

The secondary side control IC 45 outputs a control voltage for controlling the switching operation of the transistor 43 based on a drain voltage of the transistor 43. The secondary side control IC 45 includes a VCC terminal, a Drain terminal, a GATE terminal, and a GND terminal.

The VCC terminal is coupled to one terminal of the capacitor 42c and one terminal of the resistance element 42b. Another terminal of the capacitor 42c is coupled to the GND. Another terminal of the resistance element 42b is coupled to a cathode of the diode 42a. A power supply voltage generated by the diode 42a, the resistance element 42b, and the capacitor 42c is applied to the VCC terminal. The secondary side control IC 45 operates on the power supply voltage.

The Drain terminal is coupled to the one terminal of the secondary winding 37b and the drain terminal of the transistor 43 via the resistance element 42d provided to detect the drain voltage of the transistor 43.

The GATE terminal is coupled with an input terminal of the waveform shaping circuit 44. The control voltage is output from the GATE terminal. The GND terminal is coupled with the GND.

When the waveform shaping circuit 44 receives the control voltage output from the secondary side control IC 45, the waveform shaping circuit 44 converts the control voltage into an operating voltage range suitable for the transistor 43, and outputs a voltage signal after the conversion as a gate voltage. The waveform shaping circuit 10-2 or the waveform shaping circuit 10-3 described above, for example, is used as the waveform shaping circuit 44.

Incidentally, in a case where the transistor 43 is a normally off type GaN-HEMT, when the waveform shaping circuit 44 turns on the transistor 43, the waveform shaping circuit 44 applies a positive side voltage as an on voltage signal to the gate terminal of the transistor 43. In addition, when the waveform shaping circuit 44 turns off the transistor 43, the waveform shaping circuit 44 applies a negative side voltage as an off voltage signal to the gate terminal of the transistor 43.

Incidentally, the operating voltage ranges suitable for the transistors 35 and 43 do not have to coincide with each other. In that case, it suffices to apply Zener diodes 13 and capacitors 14 (or Zener diodes 15) having parameters (Zener voltage or the like) suitable for the respective operating voltage ranges of the transistors 35 and 43 as the Zener diodes 13 and the capacitors 14 (or the Zener diodes 15) used in the waveform shaping circuits 34 and 44.

The diode 42e has a function of performing rectification during a period before a start of synchronous rectification by the switching operation of the transistor 43. An anode of the diode 42e is coupled to the source terminal of the transistor 43 and the GND. The cathode of the diode 42e is coupled to the drain terminal of the transistor 43.

The diode 42a, the resistance element 42b, and the capacitor 42c generate a power supply voltage, which is a direct-current voltage for operating the secondary side control IC 45.

The anode of the diode 42a is coupled to the one terminal of the secondary winding 37b. The cathode of the diode 42a is coupled to the one terminal of the resistance element 42b. The other terminal of the resistance element 42b is coupled to the one terminal of the capacitor 42c and the VCC terminal of the secondary side control IC 45.

The bias stabilizing circuit 46 stabilizes the bias of the output voltage, and generates a signal based on the input level of the photocoupler 47. The photocoupler 47 outputs the output signal from the bias stabilizing circuit 46 as an error signal indicating an error between the output voltage (direct-current voltage) of the switching power supply device 30 and an expected value thereof. The primary side control IC 33 receives the error signal as the feedback voltage of the output voltage, and adjusts the duty ratio to an appropriate value.

Figure 13:
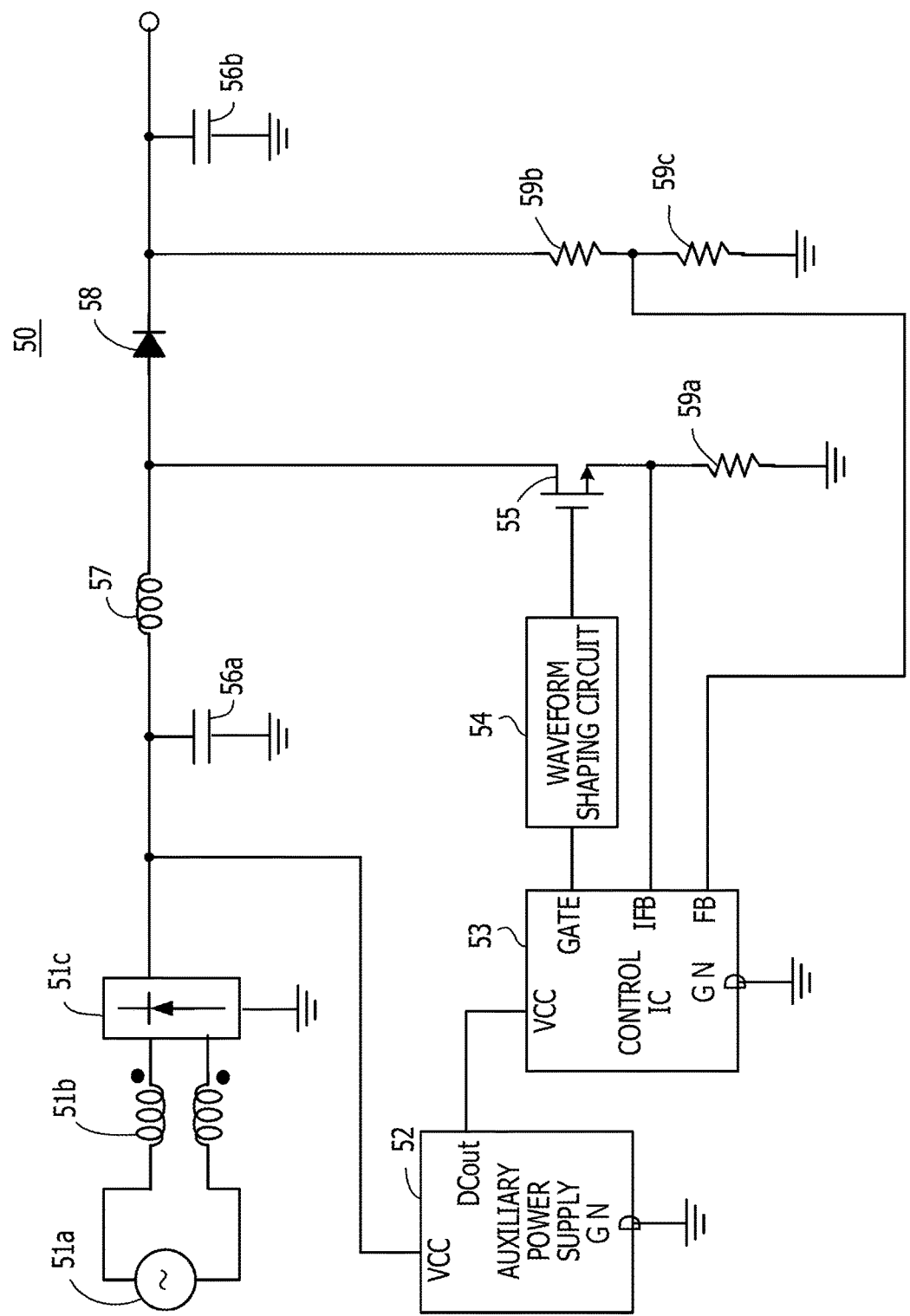
FIG. 13 is a diagram illustrating an example of a PFC device.

FIG. 13 is a diagram illustrating an example of a PFC device. A PFC device 50 improves a power factor by suppressing harmonics from an alternating-current power supply 51a. The PFC device 50 includes a common mode filter 51b, a diode bridge 51c, an auxiliary power supply 52, a control IC 53, a waveform shaping circuit 54, a transistor 55, capacitors 56a and 56b, an inductor 57, a diode 58, and resistance elements 59a, 59b, and 59c. The transistor 55 is an NMOS transistor, and is, for example, a normally off type GaN-HEMT.

In coupling relation of each circuit element, the alternating-current power supply 51a is coupled to an input side of the common mode filter 51b, and an input terminal of the diode bridge 51c is coupled to an output side of the common mode filter 51b. An output terminal of the diode bridge 51c is coupled with a VCC terminal of the auxiliary power supply 52, one terminal of the capacitor 56a, and one terminal of the inductor 57. Another terminal of the capacitor 56a is coupled to a GND.

Another terminal of the inductor 57 is coupled to a drain terminal of the transistor 55 and an anode of the diode 58. A cathode of the diode 58 is coupled to one terminal of the resistance element 59b and one terminal of the capacitor 56b. Another terminal of the capacitor 56b is coupled to the GND.

A DCout terminal of the auxiliary power supply 52 is coupled to a VCC terminal of the control IC 53. A GND terminal of the auxiliary power supply 52 is coupled to the GND. A GATE terminal of the control IC 53 is coupled to an input terminal of the waveform shaping circuit 54. An output terminal of the waveform shaping circuit 54 is coupled to a gate terminal of the transistor 55.

An IFB terminal of the control IC 53 is coupled to a source terminal of the transistor 55 and one terminal of the resistance element 59a. Another terminal of the resistance element 59a is coupled to the GND. An FB terminal of the control IC 53 is coupled to another terminal of the resistance element 59b and one terminal of the resistance element 59c. Another terminal of the resistance element 59c is coupled to the GND.

Here, the common mode filter 51b filters out a harmonic noise from an alternating-current voltage from the alternating-current power supply 51a. The diode bridge 51c rectifies the alternating-current voltage after the noise removal. The capacitor 56a smoothes the rectified input voltage. The inductor 57 is a boost inductor. The inductor 57 boosts the smoothed voltage to a given value. In addition, the signal flowing through the inductor 57 flows to the diode 58. The diode 58 rectifies the signal output from the inductor 57.

The auxiliary power supply 52 includes a VCC terminal, a DCout terminal, and a GND terminal. The VCC terminal is a terminal supplied with the output voltage of the diode bridge 51c as a power supply voltage. The DCout terminal is a terminal that outputs a direct-current voltage generated by the auxiliary power supply 52 to the control IC 53. The GND terminal is coupled to the GND.

The control IC 53 includes a VCC terminal, a GATE terminal, an IFB terminal, an FB terminal, and a GND terminal. The VCC terminal is a terminal to which the direct-current voltage output from the DCout terminal of the auxiliary power supply 52 is supplied as a power supply voltage.

The GATE terminal is a terminal that outputs a control voltage for switching the transistor 55. The IFB terminal is a terminal for performing feedback detection of a current flowing from the drain terminal to the source terminal of the transistor 55. Incidentally, when the current input to the IFB terminal is an abnormal value, the control IC 53, for example, stops the switching operation of the transistor 55 by setting the control voltage output from the GATE terminal to a given level.

The FB terminal is a terminal that receives a feedback voltage obtained by voltage division of an output voltage by the resistance elements 59b and 59c. Based on the feedback voltage, the control IC 53 adjusts a duty ratio to an appropriate value so that the output voltage is held uniform. The GND terminal is coupled to the GND.

When the waveform shaping circuit 54 receives the control voltage output from the control IC 53, the waveform shaping circuit 54 converts the control voltage into an operating voltage range suitable for the transistor 55, and outputs a voltage signal after the conversion as a gate voltage. The waveform shaping circuit 10-2 or the waveform shaping circuit 10-3 described above, for example, is used as the waveform shaping circuit 54.

The transistor 55 performs switching operation based on the gate voltage output from the waveform shaping circuit 54. When the transistor 55 is off, the signal output from the inductor 57 flows through the diode 58 and charges the capacitor 56b. When the transistor 55 is on, the signal output from the inductor 57 flows to the GND via the resistance element 59a.

Incidentally, in a case where the transistor 55 is a normally off type GaN-HEMT, when the waveform shaping circuit 54 turns on the transistor 55, the waveform shaping circuit 54 applies a positive side voltage as an on voltage signal to the gate terminal of the transistor 55. In addition, when the waveform shaping circuit 54 turns off the transistor 55, the waveform shaping circuit 54 applies a negative side voltage as an off voltage signal to the gate terminal of the transistor 55.

Figure 14:
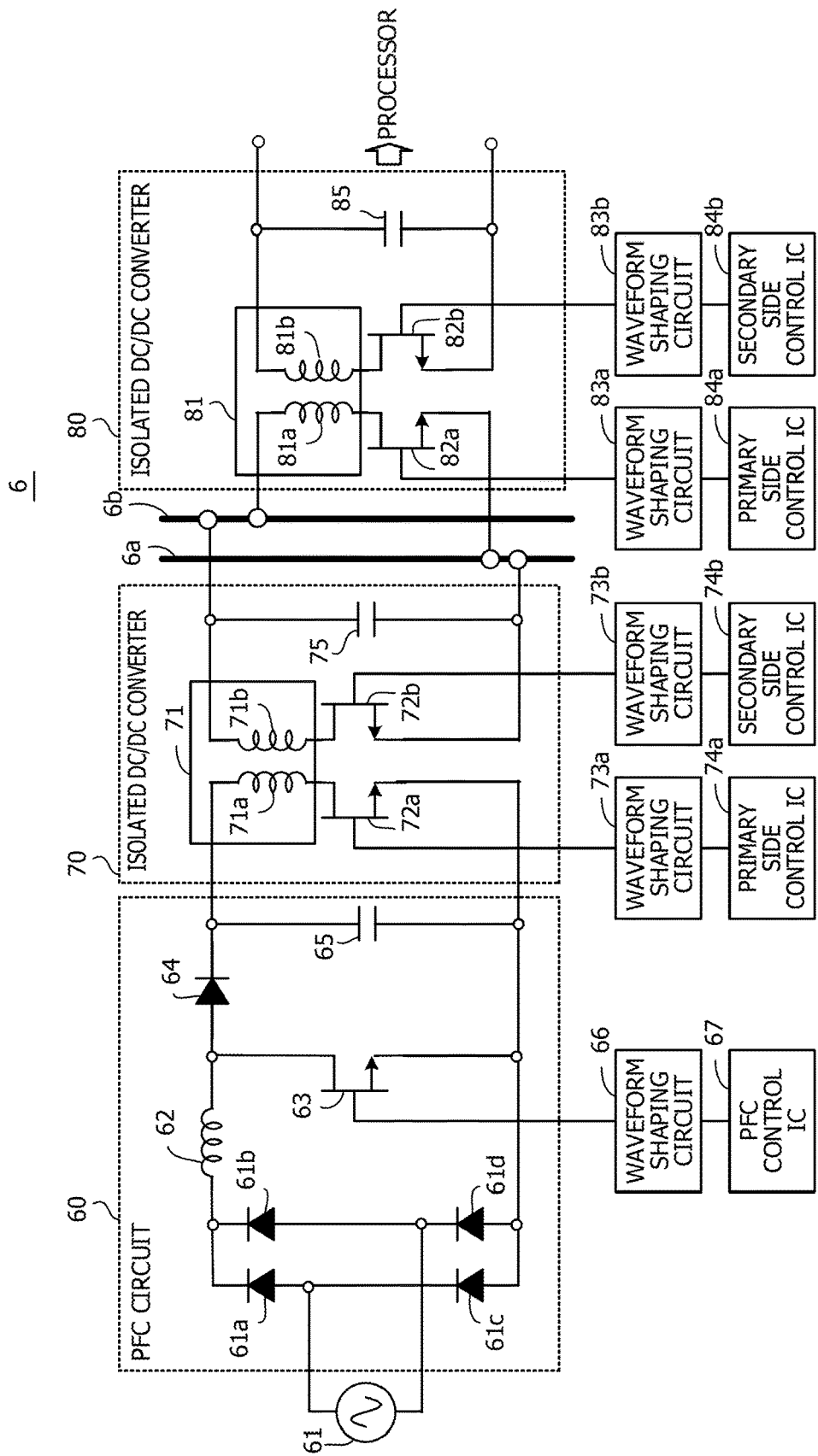
FIG. 14 is a diagram illustrating an example of a server power supply device.

FIG. 14 is a diagram illustrating an example of a server power supply device. A server power supply device 6 includes a PFC circuit 60 and isolated DC/DC converters 70 and 80. The isolated DC/DC converter 70 and the isolated DC/DC converter 80 are coupled to each other via buses (for example, 12-V buses) 6a and 6b.

The PFC circuit 60 includes diodes 61a, 61b, 61c, and 61d, an inductor 62, a transistor 63, a diode 64, and a capacitor 65. The diodes 61a, 61b, 61c, and 61d form a diode bridge. In addition, a waveform shaping circuit 66 and a PFC control IC 67 are arranged as circuits that perform driving control of the transistor 63.

The isolated DC/DC converter 70 includes a transformer 71, transistors 72a and 72b, and a capacitor 75. The transformer 71 includes a primary winding 71a and a secondary winding 71b (a core is not illustrated). In addition, a waveform shaping circuit 73a and a primary side control IC 74a are arranged as circuits that perform driving control of the transistor 72a. A waveform shaping circuit 73b and a secondary side control IC 74b are arranged as circuits that perform driving control of the transistor 72b.

The isolated DC/DC converter 80 includes a transformer 81, transistors 82a and 82b, and a capacitor 85. The transformer 81 includes a primary winding 81a and a secondary winding 81b (a core is not illustrated). In addition, a waveform shaping circuit 83a and a primary side control IC 84a are arranged as circuits that perform driving control of the transistor 82a. A waveform shaping circuit 83b and a secondary side control IC 84b are arranged as circuits that perform driving control of the transistor 82b.

The transistors 63, 72a, 72b, 82a, and 82b are an n-channel MOSFET, and are, for example, a normally off type GaN-HEMT.

In coupling relation of each circuit element, one terminal of an alternating-current power supply 61 is coupled to an anode of the diode 61a and a cathode of the diode 61c.

Another terminal of the alternating-current power supply 61 is coupled to an anode of the diode 61b and a cathode of the diode 61d.

A cathode of the diode 61a is coupled to a cathode of the diode 61b and one terminal of the inductor 62. Another terminal of the inductor 62 is coupled to a drain terminal of the transistor 63 and an anode of the diode 64. A cathode of the diode 64 is coupled to one terminal of the capacitor 65 and one terminal of the primary winding 71a of the transformer 71. Another terminal of the primary winding 71a is coupled to a drain terminal of the transistor 72a.

An anode of the diode 61c is coupled to an anode of the diode 61d, a source terminal of the transistor 63, another terminal of the capacitor 65, and a source terminal of the transistor 72a.

A gate terminal of the transistor 63 is coupled to an output terminal of the waveform shaping circuit 66. An input terminal of the waveform shaping circuit 66 is coupled to an output terminal of the PFC control IC 67.

One terminal of the secondary winding 71b of the transformer 71 is coupled to one terminal of the capacitor 75 and the bus 6b. Another terminal of the secondary winding 71b is coupled to a drain terminal of the transistor 72b. A source terminal of the transistor 72b is coupled to another terminal of the capacitor 75 and the bus 6a.

A gate terminal of the transistor 72a is coupled to an output terminal of the waveform shaping circuit 73a. An input terminal of the waveform shaping circuit 73a is coupled to an output terminal of the primary side control IC 74a. A gate terminal of the transistor 72b is coupled to an output terminal of the waveform shaping circuit 73b. An input terminal of the waveform shaping circuit 73b is coupled to an output terminal of the secondary side control IC 74b.

One terminal of the primary winding 81a of the transformer 81 is coupled to the bus 6b. Another terminal of the primary winding 81a is coupled to a drain terminal of the transistor 82a. A source terminal of the transistor 82a is coupled to the bus 6a.

One terminal of the secondary winding 81b of the transformer 81 is coupled to one terminal of the capacitor 85 and one terminal of an output terminal. Another terminal of the secondary winding 81b is coupled to a drain terminal of the transistor 82b. A source terminal of the transistor 82b is coupled to another terminal of the capacitor 85 and another terminal of the output terminal.

A gate terminal of the transistor 82a is coupled to an output terminal of the waveform shaping circuit 83a. An input terminal of the waveform shaping circuit 83a is coupled to an output terminal of the primary side control IC 84a. A gate terminal of the transistor 82b is coupled to an output terminal of the waveform shaping circuit 83b. An input terminal of the waveform shaping circuit 83b is coupled to an output terminal of the secondary side control IC 84b.

The PFC circuit 60 improves a power factor by suppressing harmonics from the alternating-current power supply 61. The PFC control IC 67 outputs a control voltage for switching the transistor 63. When the waveform shaping circuit 66 receives the control voltage output from the PFC control IC 67, the waveform shaping circuit 66 converts the control voltage to an operating voltage range suitable for the transistor 63, and outputs a voltage signal after the conversion as a gate voltage. The waveform shaping circuit 10-2 or the waveform shaping circuit 10-3 described above, for example, is used as the waveform shaping circuit 66. The transistor 63 is turned on or off according to the gate voltage supplied from the waveform shaping circuit 66.

The isolated DC/DC converter 70 achieves an electric insulation between an input side and an output side by using the transformer 71, and converts a DC voltage output from the PFC circuit 60 to a given DC voltage. The primary side control IC 74a outputs a control voltage for switching the transistor 72a. The secondary side control IC 74b outputs a control voltage for switching the transistor 72b.

When the waveform shaping circuit 73a receives a control voltage output from the primary side control IC 74a, the waveform shaping circuit 73a converts the control voltage into an operating voltage range suitable for the transistor 72a, and outputs a voltage signal after the conversion as a gate voltage. When the waveform shaping circuit 73b receives a control voltage output from the secondary side control IC 74b, the waveform shaping circuit 73b converts the control voltage into an operating voltage range suitable for the transistor 72b, and outputs a voltage signal after the conversion as a gate voltage.

The waveform shaping circuit 10-2 or the waveform shaping circuit 10-3 described above, for example, is used as the waveform shaping circuits 73a and 73b. The transistors 72a and 72b are turned on or off according to the gate voltages supplied from the waveform shaping circuits 73a and 73b, respectively.

The isolated DC/DC converter 80 achieves electric insulation between an input side and an output side by using the transformer 81, and converts the DC voltage output from the isolated DC/DC converter 70 to a given operating voltage for a processor such as a central processing unit (CPU) or the like. The primary side control IC 84a outputs a control voltage for switching the transistor 82a. The secondary side control IC 84b outputs a control voltage for switching the transistor 82b.

When the waveform shaping circuit 83a receives the control voltage output from the primary side control IC 84a, the waveform shaping circuit 83a converts the control voltage into an operating voltage range suitable for the transistor 82a, and outputs a voltage signal after the conversion as a gate voltage. When the waveform shaping circuit 83b receives the control voltage output from the secondary side control IC 84b, the waveform shaping circuit 83b converts the control voltage into an operating voltage range suitable for the transistor 82b, and outputs a voltage signal after the conversion as a gate voltage.

The waveform shaping circuit 10-2 or the waveform shaping circuit 10-3 described above, for example, is used as the waveform shaping circuits 83a and 83b. The transistors 82a and 82b are turned on or off according to the gate voltages supplied from the waveform shaping circuits 83a and 83b, respectively.

(Modifications)

Figure 15:
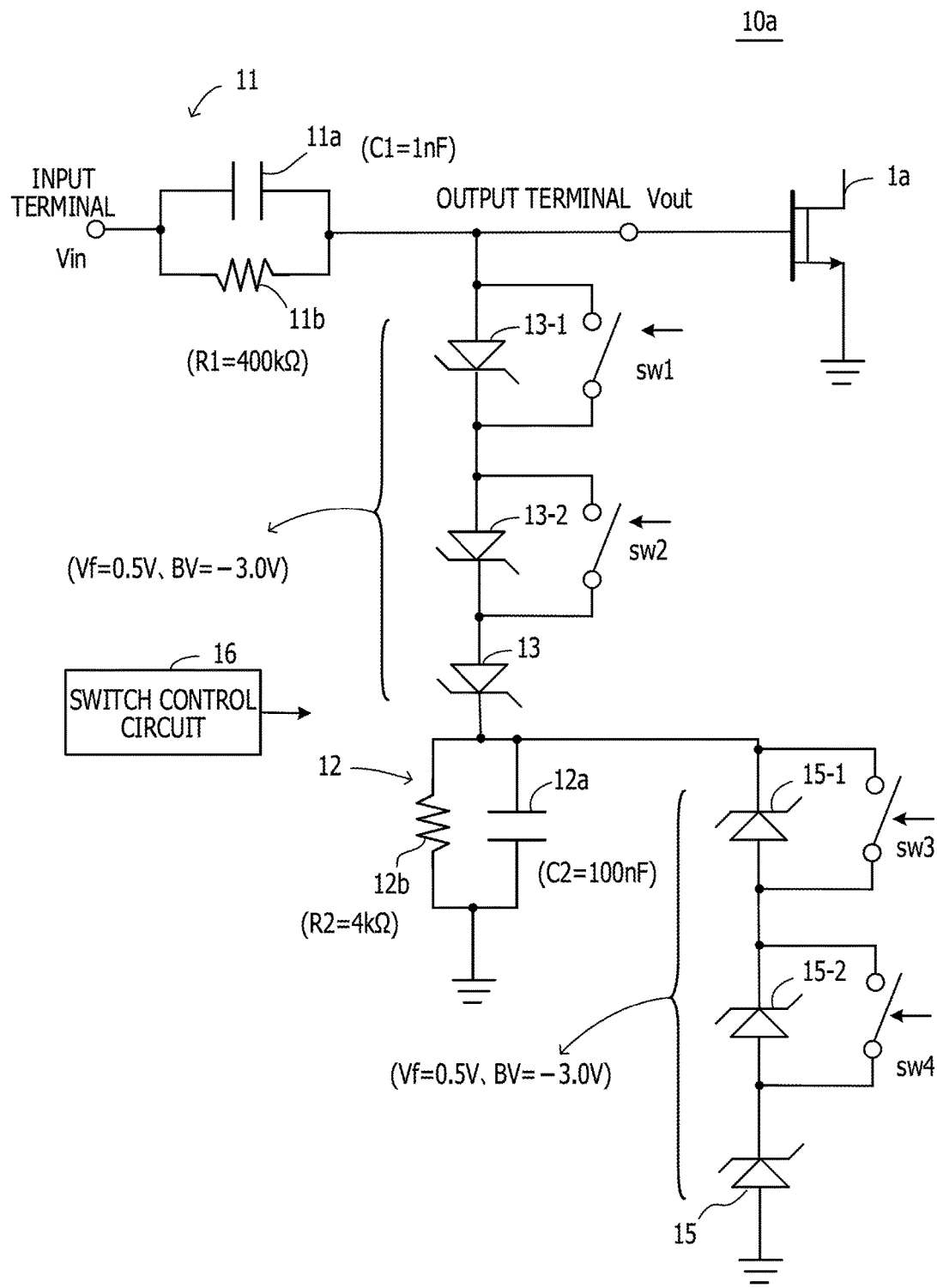
FIG. 15 is a diagram illustrating a modification of a waveform shaping circuit.

FIG. 15 is a diagram illustrating a modification of a waveform shaping circuit. In FIG. 15, the same elements as in the waveform shaping circuit 10-3 according to the third embodiment illustrated in FIG. 9 are identified by the same reference numerals.

A waveform shaping circuit 10a includes Zener diodes 13-1 and 13-2 coupled in series with a Zener diode 13 and switches sw1 and sw2 coupled in parallel with the Zener diodes 13-1 and 13-2, respectively. The waveform shaping circuit 10a also includes Zener diodes 15-1 and 15-2 coupled in series with a Zener diode 15 and switches sw3 and sw4 coupled in parallel with the Zener diodes 15-1 and 15-2, respectively. The waveform shaping circuit 10a further includes a switch control circuit 16 that controls on/off states of the switches sw1 to sw4.

According to such a waveform shaping circuit 10a, the switch control circuit 16 controls the on/off states of the switches sw1 to sw4, so that an upper limit voltage (VH) and a lower limit voltage (VL) of a gate voltage of a transistor 1a may be controlled.

Incidentally, the number of Zener diodes 13-1 and 13-2 may be two, and, maybe one or three or more. A similar is true for the Zener diodes 15-1 and 15-2.

FIG. 16 is a diagram illustrating an example of control of a gate voltage based on switching. Incidentally, suppose that, as concrete values of circuit elements, a capacitance C1 of the capacitor 11a is 1 nF, a resistance value R1 of the resistance element 11b is 400 kΩ, a capacitance C2 of the capacitor 12a is 100 nF, and a resistance value R2 of the resistance element 12b is 4 kΩ. In addition, suppose that a forward voltage Vf of the Zener diodes 13, 13-1, and 13-2 is 0.5 V, a Zener voltage BV of the Zener diodes 13, 13-1, and 13-2 is −3.0 V, a forward voltage Vf of the Zener diodes 15, 15-1, and 15-2 is 0.5 V, and a Zener voltage BV of the Zener diodes 15, 15-1, and 15-2 is −3.0 V.

A table T1 illustrates relation between the upper limit voltage (VH)/lower limit voltage (VL) of the gate voltage and combinations of the on/off states of the switches sw1 to sw4.

For example, in a case where a switch opening and closing pattern is (sw1, sw2, sw3, sw4)=(on, on, on, on) in a section L1 of the table T1, the gate voltage having an upper limit voltage VH of 3 V and a lower limit voltage VL of −3 V is generated in the waveform shaping circuit 10a, and is applied to the gate terminal of the transistor 1a.

In addition, in a case where a switch opening and closing pattern is (sw1, sw2, sw3, sw4)=(on, on, on, off) in a section L2 of the table T1, the gate voltage having an upper limit voltage VH of 6 V and a lower limit voltage VL of −3 V is generated in the waveform shaping circuit 10a, and is applied to the gate terminal of the transistor 1a.

The gate voltage may be set variably by thus making series coupling of pluralities of Zener diodes, and controlling the conduction states of the given Zener diodes by switching. It is therefore possible to accommodate various gate voltage ratings flexibly.

Incidentally, while the Zener diodes 15, 15-1, and 15-2 are used in the example of FIG. 15, the capacitor 14 illustrated in FIG. 6 and one or a plurality of capacitors that are similar nonlinear elements to the capacitor 14 and are coupled in series with the capacitor 14 may be used.

In addition, the switch control circuit 16 may detect an undershoot of the gate voltage, and control the switches sw1 to sw4 based on a result of the detection so that the range of the gate voltage is in an appropriate range.

One aspect of the waveform shaping circuit, the semiconductor device, and the switching power supply device according to the present technology has been described above based on embodiments. However, the embodiments are mere examples, and are not limited to the foregoing description.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A waveform shaping circuit comprising:
a first parallel circuit including a first capacitance element and a first resistance element coupled in parallel with each other, a positive pulse voltage being applied to a first terminal of the first capacitance element and a second terminal of the first resistance element, a gate terminal of a field-effect transistor being electrically coupled to a third terminal of the first capacitance element and a fourth terminal of the first resistance element;
a first Zener diode having a first anode coupled to the third terminal and the fourth terminal; and
a second parallel circuit including a second capacitance element and a second resistance element coupled in parallel with each other, a first cathode of the first Zener diode being coupled to a fifth terminal of the second capacitance element and a sixth terminal of the second resistance element, and a seventh terminal of the second capacitance element and an eighth terminal of the second resistance element being at a reference potential.

2. The waveform shaping circuit according to claim 1, further comprising:
a nonlinear element having one terminal coupled to the fifth terminal, the sixth terminal, and the first cathode, and having another terminal at the reference potential, wherein
a current flowing through the nonlinear element nonlinearly changes in response to a change in applied voltage.

3. The waveform shaping circuit according to claim 2, wherein
the nonlinear element is a capacitor in which a slope of increase in capacitance value increases with an increase in the applied voltage.

4. The waveform shaping circuit according to claim 2, wherein
the nonlinear element is a second Zener diode having a second cathode coupled to the fifth terminal, the sixth terminal, and the first cathode, and having a second anode at the reference potential.

5. The waveform shaping circuit according to claim 2, further comprising:
one or a plurality of Zener diodes coupled in series with the first Zener diode;
a first switch coupled in parallel with each of the one or plurality of Zener diodes;
one or a plurality of nonlinear elements coupled in series with the nonlinear element;
a second switch coupled in parallel with each of the one or plurality of nonlinear elements; and
a switch control circuit configured to control on-off states of the first switch and the second switch.

6. The waveform shaping circuit according to claim 1, wherein
the field-effect transistor is a normally off type gallium nitride-high electron mobility transistor.

7. A semiconductor device comprising:
a field-effect transistor; and
a waveform shaping circuit including
a first parallel circuit including a first capacitance element and a first resistance element coupled in parallel with each other, a positive pulse voltage being applied to a first terminal of the first capacitance element and a second terminal of the first resistance element, a gate terminal of the field-effect transistor being electrically coupled to a third terminal of the first capacitance element and a fourth terminal of the first resistance element,
a Zener diode having a first anode coupled to the third terminal and the fourth terminal, and
a second parallel circuit including a second capacitance element and a second resistance element coupled in parallel with each other, a first cathode of the Zener diode being coupled to a fifth terminal of the second capacitance element and a sixth terminal of the second resistance element, and a seventh terminal of the second capacitance element and an eighth terminal of the second resistance element being at a reference potential.

8. A switching power supply device comprising:
a field-effect transistor configured to output a pulsed alternating-current signal by switching operation;
a control circuit configured to output a control signal that controls the switching operation of the field-effect transistor; and
a waveform shaping circuit including
a first parallel circuit including a first capacitance element and a first resistance element coupled in parallel with each other, the control signal being supplied to a first terminal of the first capacitance element and a second terminal of the first resistance element, a gate terminal of the field-effect transistor being electrically coupled to a third terminal of the first capacitance element and a fourth terminal of the first resistance element,
a Zener diode having a first anode coupled to the third terminal and the fourth terminal, and
a second parallel circuit including a second capacitance element and a second resistance element coupled in parallel with each other, a first cathode of the Zener diode being coupled to a fifth terminal of the second capacitance element and a sixth terminal of the second resistance element, and a seventh terminal of the second capacitance element and an eighth terminal of the second resistance element being at a reference potential.

* * * * *